(12) United States Patent
Chang

(10) Patent No.: US 8,183,162 B2
(45) Date of Patent: May 22, 2012

(54) METHOD OF FORMING A SACRIFICIAL LAYER

(75) Inventor: Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 355 days.

(21) Appl. No.: 12/536,805

(22) Filed: Aug. 6, 2009

(65) Prior Publication Data
US 2010/0093176 A1    Apr. 15, 2010

Related U.S. Application Data

(60) Provisional application No. 61/096,566, filed on Sep. 12, 2008.

(51) Int. Cl.
*H01L 21/302* (2006.01)
(52) U.S. Cl. ......... 438/754; 438/734; 438/736; 438/745
(58) Field of Classification Search .................. 438/745, 438/750, 754, 734, 735, 736; 216/95, 103
See application file for complete search history.

(56) References Cited

U.S. PATENT DOCUMENTS

| | | | |
|---|---|---|---|
| 5,907,791 A * | 5/1999 | Cappuzzo et al. | 438/669 |
| 6,749,760 B2 * | 6/2004 | Danielson et al. | 216/13 |
| 7,176,092 B2 * | 2/2007 | Yeo et al. | 438/283 |
| 7,732,224 B2 * | 6/2010 | Baek | 438/4 |
| 2004/0023452 A1 * | 2/2004 | Wang et al. | 438/202 |
| 2005/0116317 A1 * | 6/2005 | Lee et al. | 257/531 |

* cited by examiner

*Primary Examiner* — Lan Vinh
(74) *Attorney, Agent, or Firm* — Haynes and Boone, LLP

(57) ABSTRACT

The present disclosure provides a method for making a semiconductor device. The method includes forming a material layer on a substrate; forming a sacrificial layer on the material layer, where the material layer and sacrificial layer each as a thickness less than 100 angstrom; forming a patterned photoresist layer on the sacrificial layer; applying a first wet etching process to etch the sacrificial layer to form a patterned sacrificial layer using the patterned photoresist layer as a mask; applying a second wet etching process to etch the first material layer; and applying a third wet etching process to remove the patterned sacrificial layer.

20 Claims, 4 Drawing Sheets

METHOD OF FORMING A SACRIFICIAL LAYER

PRIORITY DATA

This application claims priority to Provisional Application Ser. No. 61/096,566 filed on Sep. 12, 2008, entitled "METHOD OF FORMING A SACRIFICIAL LAYER", the entire disclosure of which is incorporated herein by reference.

BACKGROUND

In advanced technology nodes of integrated circuit industry, high k dielectric material and metal are adopted to form a metal gate stack of metal-oxide-semiconductor field-effect transistors (MOSFETs). In a method to form a metal gate stack, a metal layer is deposited and etched. During the metal etch, the etch processing window is not enough and the photoresist (resist) may experience a peeling issue at the metal etch step. The exposed metal film cannot be completely etched away and the patterned resist can be peeled from the underlying metal film. The wet etch solution can penetrate to the interface between the patterned resist and the metal film and oxidize the metal film underlying the patterned resist. This further changes the metal film and degrades the device performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

DETAILED DESCRIPTION

Figure 1:
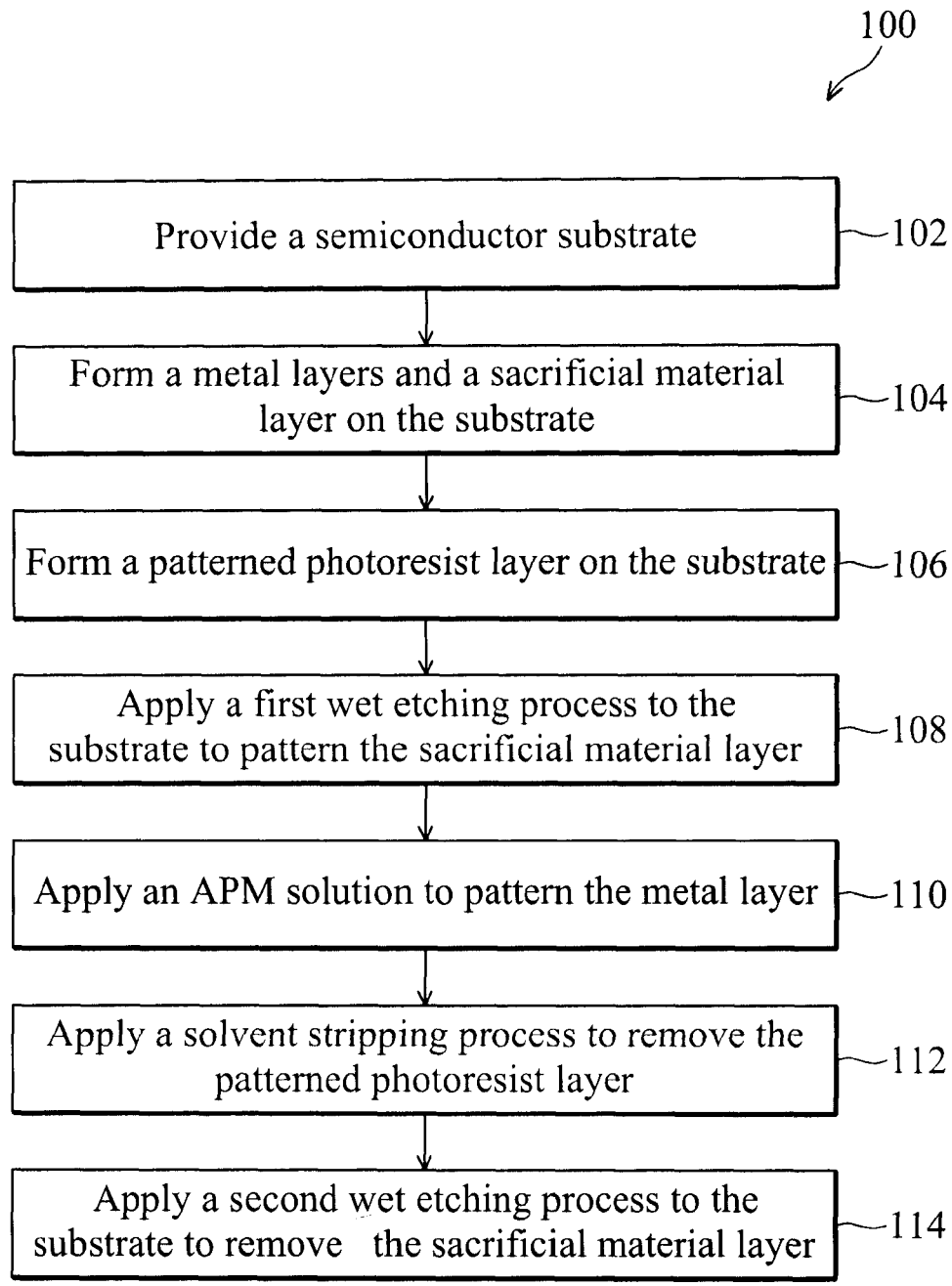
FIG. 1 is a flowchart of a method making a semiconductor device in one embodiment constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of one embodiment of a method 100 making a semiconductor device having a metal gate stack constructed according to aspects of the present disclosure. FIGS. 2 through 8 are sectional views of one embodiment of a semiconductor structure 200 at various fabrication stages. The method 100 of making a semiconductor device is described with reference to FIGS. 1 through 8.

Figure 2:
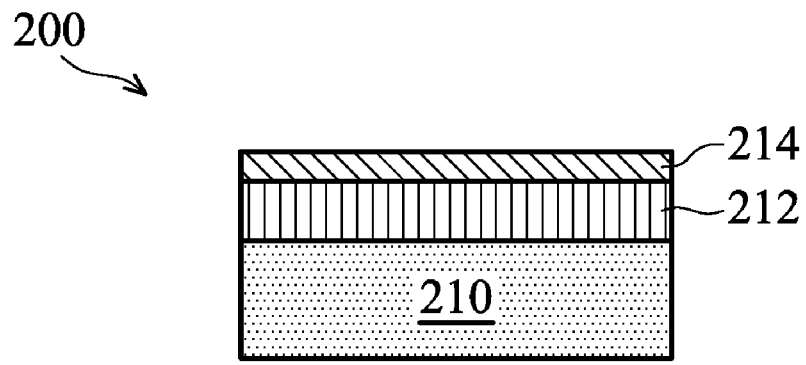
FIGS. 2 through 8 are sectional views of one embodiment of a semiconductor structure having a metal gate stack at various fabrication stages constructed according to aspects of the present disclosure.

Referring to FIGS. 1 and 2, the method 100 begins at step 102 by providing a semiconductor substrate 210. The semiconductor substrate 210 includes silicon. Alternatively, the substrate 210 includes germanium, silicon germanium or other suitable semiconductor material, such as diamond, silicon carbide or gallium arsenic. The substrate 210 may further include additional features and/or material layers, such as various isolation features formed in the substrate. The substrate 210 may include various p-type doped regions and/or n-type doped regions configured and coupled to form various devices and functional features. All doping features may be achieved using a process such as ion implantation or diffusion in various steps and techniques. The substrate 210 may include other features such as a shallow trench isolation (STI).

The substrate 210 may further include various dielectric-metal-gate-stack material layers. In one embodiment, a high k dielectric material layer is formed on the semiconductor substrate 210. The high k dielectric material layer is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. Alternatively, the high k dielectric material layer includes metal nitrides, metal silicates or other metal oxides.

A capping layer may be further formed on the high k dielectric material layer. In one embodiment, the capping layer includes lanthanum oxide (LaO). In another embodiment, the capping layer includes aluminum oxide (Al2O3). The capping layer may alternatively includes other suitable material.

An interfacial layer (IL) may be interposed between the semiconductor substrate 210 and the high k dielectric material layer. The interfacial layer may include a thin silicon oxide layer and is formed on the silicon substrate 210 before forming the high k dielectric material layer. The thin silicon oxide layer may be formed by atomic layer deposition (ALD) or thermal oxidation.

Figure 3:
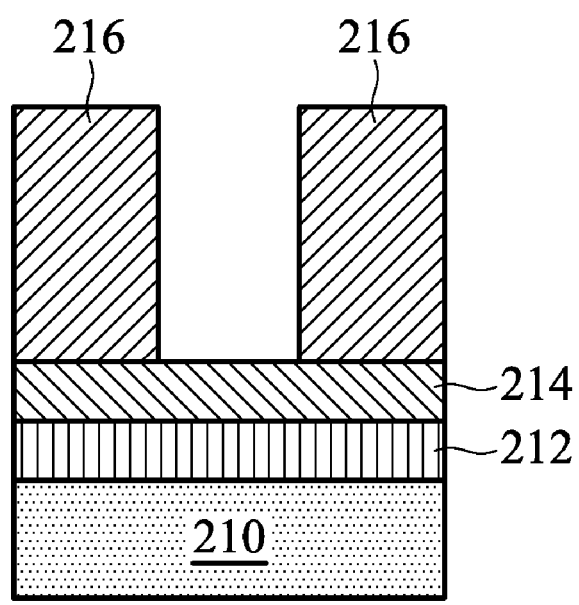

Still referring to FIGS. 1 and 3, the method 100 proceeds to step 104 by forming a first material layer 212 on the substrate 210 and a second material layer 214 on the first material layer 212. The first and second material layers each has a thickness less than about 100 angstrom. The first material layer 212 includes a metal. The metal layer includes titanium nitride (TiN). Alternatively, the metal layer includes tantalum nitride (TaN), molybdenum nitride (MoN), tungsten nitride (WN), tungsten (W), tantalum carbide (TaC), tantalum carbide nitride (TaCN), titanium aluminum nitride (TiAlN), aluminum (Al), tungsten (W) or polysilicon. The metal layer is formed by a physical vapor deposition (PVD) technique or other suitable method. The metal layer may have a thickness ranging between 5 angstrom and 100 angstrom. As an example, the metal layer has a thickness of about 50 angstrom. The second material layer 214 is a sacrificial material layer that is implemented during the disclosed process to pattern the metal layer and is removed thereafter. The sacrificial material layer include lanthanum oxide (LaO). Alternatively, the sacrificial material layer includes aluminum oxide (Al2O3). The sacrificial material layer may have a thickness ranging between 5 angstrom and 100 angstrom. As an example, the sacrificial material layer has a thickness of about 20 angstrom. The sacrificial material layer may be formed by PVD or other suitable method.

Referring to FIGS. 1 and 3, the method 100 proceeds to step 106 by forming a patterned photoresist layer 216 on the substrate 210. The patterned photoresist layer 216 is used as a mask to pattern the sacrificial material layer and the metal layer. Particularly, the patterned photoresist layer 216 is formed on the sacrificial material layer as illustrated in FIG. 3. The patterned photoresist layer is formed by a photolithography process. An exemplary photolithography process may include processing steps of photoresist coating, soft baking, mask aligning, exposing, post-exposure baking, developing photoresist and hard baking. The lithography process may implement krypton fluoride (KrF) excimer lasers, argon fluoride (ArF) excimer lasers, ArF immersion lithography, extreme ultra-violet (EUV) or electron-beam writing (e-beam). The photolithography exposing process may also be implemented or replaced by other proper methods such as maskless photolithography, ion-beam writing, and molecular imprint. Additionally, a hexamethyl disilazane (HMDS) solution is applied to the sacrificial material layer to enhance resist adhesion before the coating on the resist layer. In one embodiment, the patterned resist layer 216 defines various openings to expose the underlying sacrificial material layer. The patterned photoresist layer define various gate regions or the openings of the patterned resist layer defines the regions wherein the gate stack material layers is to be removed.

Figure 4:
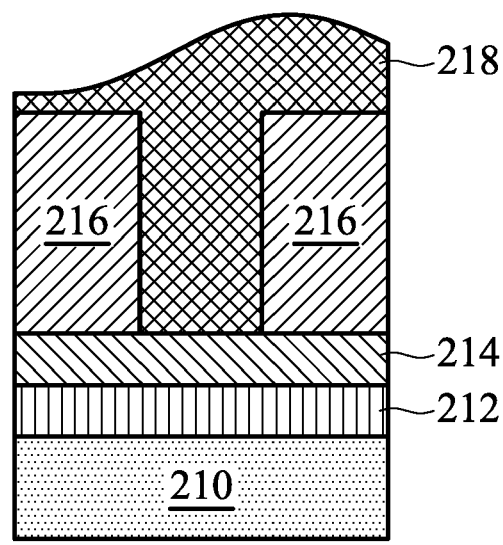

Referring to FIGS. 1 and 4, the method 100 may include an additional cleaning step after the formation of the patterned resist layer. At this step, a cleaning material 218 is applied to the patterned resist layer to clean organic residue or other residues. The cleaning material is capable of removing the organic residue. As one example, the cleaning material includes a top anti-reflective coating (TARC) layer. In this case, the TARC is coated on the substrate and is further baked and rinsed. Alternatively or additionally, the cleaning material includes solvent, surfactant or polymer ingredient.

Figure 5:
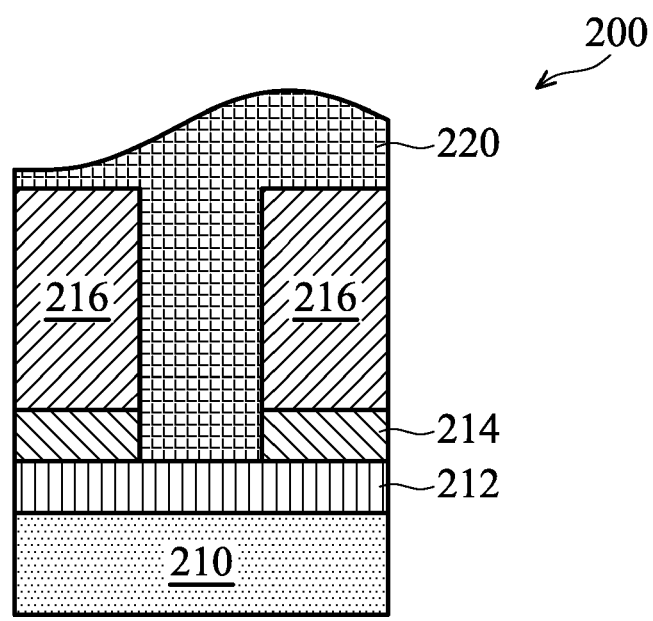

Referring to FIGS. 1 and 5, the method 100 proceeds to step 108 by applying a first wet etchant 220 in a first wet etching process to the substrate to etch the sacrificial material layer using the patterned resist layer as an etch mask. The sacrificial material layer within the openings of the patterned mask is removed by the first wet etching process and the metal layer 212 is exposed thereafter. In one embodiment, LaO is used as the sacrificial material layer and the first etching process utilizes hydrochloric acid (HCl). For example, the first wet etching solution includes HCl and water (H2O). The HCl/H2O ration may range from about 1:1 to about 1:1000. The etching duration may have a range between about 5 second and about 5 minute. In another embodiment, the first wet etching solution includes a weak acid. In one example, the weak acid solution include carbon oxide (CO2) water. In another example, the first wet etching solution includes, acetic acid solution, citric acid, boric acid or phosphoric acid. In another embodiment, the sacrificial material layer includes Al2O3 and the first wet etchant includes a resist developer. For example, a tetramethylammonium hydroxide (TMAH) solution is used to remove the Al2O3 sacrificial material layer. In furtherance of the above embodiments, a wet etching solution having a pH value below than 7 may be used to etch the LaO sacrificial material layer. A wet etching solution having a pH value higher than 8 may be used to etch the Al2O3 sacrificial material layer.

Figure 6:
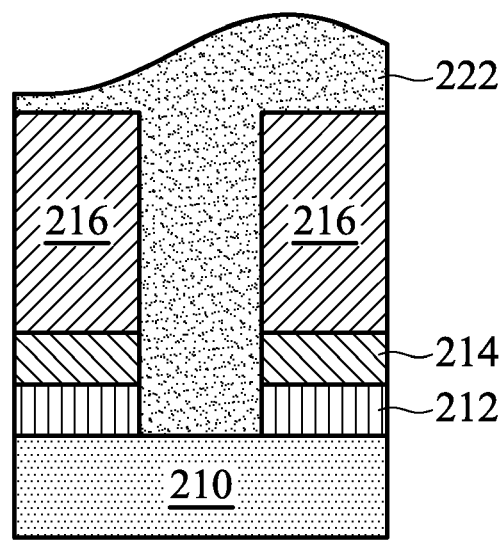

Referring to FIGS. 1 and 6, the method 100 proceeds to step 110 by applying a wet etchant 220 to the second material layer 212. In one embodiment, the metal layer 212 includes titanium nitride (TiN). The wet etching process applied to the TiN layer at this step includes an ammonia hydroxide-hydrogen peroxide-water mixture (APM) solution.

Figure 7:
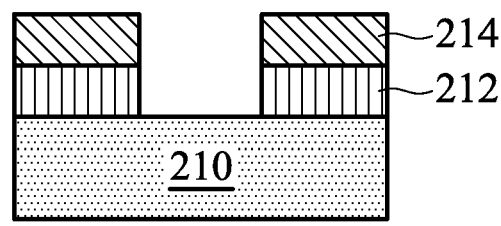

Referring to FIGS. 1 and 7, the method 100 proceeds to step 112 by applying a stripping solution 222 to remove the patterned resist layer 216. Instead of using a plasma ashing, a stripping solution is used. In various embodiments, the stripping solution includes N-methyl-2-pyrrolidine (NMP), cyclohexanol, cyclopentanol, dimethy sulfoxide (DMSO), propylene glycol monomethyl ether (PGME) or Propylene glycol monomethyl ether acetate (PGMEA). Alternatively, the step 112 to remove the patterned resist layer by the stripping solution can be performed between the step 108 to wet etch the sacrificial material layer 214 and the step 110 to wet etch the metal layer 212. In this case, the patterned sacrificial material layer is used as the mask to etch the metal layer.

Figure 8:
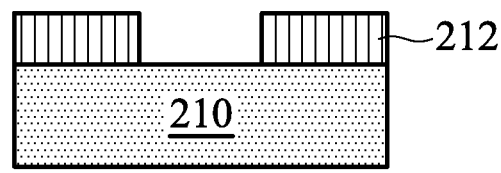

Referring to FIGS. 1 and 8, the method 100 proceeds to step 114 by applying a second wet etchant to the substrate to remove the patterned sacrificial material layer. The second wet etchant is similar to the first etchant used at step 108 to pattern the sacrificial material layer. In one embodiment, the patterned sacrificial material layer includes LaO and the second etchant includes hydrochloric acid (HCl). For example, the first wet etching solution includes HCl and water (H2O). The HCl/H2O ratio may range from about 1:1 to about 1:1000. The etching duration may have a range between about 5 second and about 5 minute. In another embodiment, the first wet etching solution includes a weak acid. In one example, the weak acid solution include carbon oxide (CO2) water. In another example, the first wet etching solution includes, acetic acid solution, citric acid, boric acid or phosphoric acid. In another embodiment, the patterned sacrificial material layer includes Al2O3 and the second wet etchant includes a resist developer. For example, a tetramethylammonium hydroxide (TMAH) solution is used to remove the Al2O3 sacrificial material layer.

Various advantages may be present in various applications of the disclosed method. It is understood that different embodiments disclose herein offer different advantages and that no particular advantage is necessarily required for all embodiments. As one example, by using the sacrificial material layer, the wet etching process to the first material layer, such as TiN, may use the patterned sacrificial material layer as an etching mask. Therefore, the etch time may be longer without the resist peeling issue. In another embodiment, when the wet etchant used to pattern the first material layer has a higher wet etch selectivity relative to the sacrificial material layer. The second material layer is not necessarily thick. The wet etch time to the second material layer can be reduced and the resist peeling issue is also eliminated. In another example, the porous TiN will no longer absorb or adhere to PR during and after the associated wet etching process. Therefore, the resist residue on TiN surface is also eliminated. In addition, since the sacrificial material layer is completely removed afterward, the resist residue, if any, will be cleaned away as well after the sacrificial material layer is removed. In another embodiment, the sacrificial material layer includes metal oxide and can also be used as a stop layer to eliminate H2O2 oxidation to the first metal layer. In another embodiment, when the sacrificial material layer is formed on the first material layer, the first material layer will have a good lateral etch control.

Although not shown, other processing step may present to form various doped regions such as source and drain regions, devices features such as multilayer interconnection (MLI). In one example, the first material layer may alternatively include other material layer to be patterned. For example, the first material layer includes high k dielectric material layer, such as hafnium oxide. In another example, the second material layer can include other suitable metal oxide to be implemented in this wet etch process flow to pattern metal gate stack with reduced or eliminated resist peeling issue.

In another example, additional patterning steps may be applied to the substrate to further pattern the metal gate stack. In another example, the light doped drain (LDD) regions are formed after the formation of the gate stack. A gate spacer may be formed on the sidewalls of the metal gate stack. Then the source and drain regions are formed substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials.

The multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The semiconductor substrate may further include additional isolation features to isolate each from other devices. The isolation features may include different structures and can be formed using different processing technologies. For example, an isolation feature may include shallow trench isolation (STI) features. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The semiconductor structure 200 serves only as one example of a device within which various aspects of the method 100 may be implemented. The disclosed semiconductor structure and the method of making the same may be used in other semiconductor devices having metal gate features, such as strained semiconductor substrate, a heterosemiconductor device or a stress-free isolation structure.

The present disclosure is not limited to applications in which the semiconductor structure includes a MOS transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor structure 150 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one example, the second material layer may include tungsten oxide. In one embodiment, the disclosed method is used to form one or more metal-oxide-semiconductor field-effect-transistors (MOSFETs). In another embodiment, the disclosed method is used to form a metal gate stack in a gate-first process in which the metal gate stack is formed by the disclosed method and remains in the final structure. In another embodiment, the disclosed method is used to form a metal gate stack in a hybrid process in which the first type metal gate stack (such as NMOS metal gate stack) is formed by the disclosed method and remains in the final structure. The second type of the metal gate stack (such as PMOS metal gate stack) is formed as a dummy gate structure so that source/drain ion implantation processes and annealing processes can be implemented. Thereafter, a portion of the dummy gate stack is removed and the dummy gate trench is refilled with proper materials. In another embodiment, the disclosed method is used to form a metal gate stack in a gate-last process in which a dummy metal gate stack is formed by the disclosed method and is then, after the formation of the source and drain features, replaced with final metal layer materials collectively or individually for NMOS and PMOS.

In another embodiment, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer.

Thus, the present disclosure provides a method for making a semiconductor device. The method includes forming a material layer on a substrate; forming a sacrificial layer on the material layer, wherein the material layer and sacrificial layer each as a thickness less than 100 angstrom; forming a patterned photoresist layer on the sacrificial layer; applying a first wet etching process to the substrate to etch the sacrificial layer to form a patterned sacrificial layer using the patterned photoresist layer as a mask; applying a second wet etching process to the substrate to etch the material layer; and applying a third wet etching process to remove the patterned sacrificial layer.

The disclosed method may further include applying a wet chemical to the substrate to remove the patterned photoresist layer after the applying the first wet etching process and before the applying the third wet etching process. The applying the wet chemical to the substrate may be implemented before the applying the second wet etching process. In one embodiment, the material layer includes titanium nitride (TiN). In another embodiment, the sacrificial layer includes lanthanum oxide (LaO). The first and third wet etching processes each includes an etchant having a hydrochloric acid (HCl). The first and third wet etching processes each include applying carbon oxide ($CO_2$) water. In another embodiment, the sacrificial layer includes aluminum oxide ($Al_2O_3$). The first and third wet etching processes each includes applying a tetramethylammonium hydroxide (TMAH) solution. The first wet etching process may include applying a weak acid solution to the substrate, the weak acid solution is selected from the group consisting of $CO_2$ water, acetic acid solution, citric acid, boric acid and phosphoric acid. The second wet etching process may include applying an ammonia hydroxide-hydrogen peroxide-water mixture (APM) to the substrate. The method may further include applying hexamethyl disilazane (HMDS) to the sacrificial material layer before the forming the patterned photoresist layer. The method may further include applying a cleaning material to the patterned photoresist layer before the applying the first wet etching process.

The present disclosure also provides another embodiment of a method for making a semiconductor device. The method includes forming a titanium nitride (TiN) layer on a substrate; forming a lanthanum oxide ((LaO) layer on the TiN layer; forming a patterned photoresist layer on the LaO layer; applying a first wet etching process to the substrate to etch the LaO layer to form a patterned LaO layer using the patterned photoresist layer as a mask; applying an ammonia hydroxide-hydrogen peroxide-water mixture (APM) to the substrate to etch the TiN layer; and applying a second wet etching process to remove the LaO layer.

The disclosed method may further include applying a wet chemical to the substrate to remove the patterned photoresist layer after the applying the first wet etching process and before the applying the APM. The method may further include applying a wet chemical to the substrate to remove the patterned photoresist layer after the applying the APM and before the applying the second wet etching process. The wet chemical may be selected from the group consisting of N-methyl-2-pyrrolidine (NMP), cyclohexanol, cyclopentanol, dimethy sulfoxide (DMSO), propylene glycol monomethyl ether (PGME) and Propylene glycol monomethyl ether acetate (PGMEA). The first and second wet etching processes each includes an etchant having hydrochloric acid (HCl) and water ($H_2O$) in one embodiment. Alternatively, the first and second wet etching processes each may include an etchant having a photoresist developer. The first wet etching process may include applying to the substrate with a weak acid solution selected from the group consisting of carbon oxide ($CO_2$) water, acetic acid solution, citric acid, boric acid and phosphoric acid.

The present disclosure also provides a method for making a semiconductor device. The method includes forming a first material layer on a substrate; forming a second material layer on the first material layer; forming a patterned photoresist layer on the second layer; applying a first wet etching process to the substrate to etch the second material layer to form a patterned second material layer using the patterned photoresist layer as a mask; applying an ammonia hydroxide-hydrogen peroxide-water mixture (APM) to the substrate to etch the first material layer; and applying a second wet etching process to remove the patterned first material layer. The first material layer may include a material selected from the group consisting of MoN, TaC, TiN, TiAlN, TaN, Al and polysilicon. The applying the APM may include patterning the first material layer to form a metal gate of a field-effect transistor (FET). The second material layer includes lanthanum oxide (LaO) in one embodiment. The first and second wet etching processes each may include applying a chemical solution with a pH value less than about 7. In this case, the first and second wet etching processes each may include applying hydrochloric acid (HCl) and water ($H_2O$). The second material layer may include aluminum oxide ($Al_2O_3$). In this case, the first and second wet etching processes each may include applying a chemical solution with a pH value higher than about 8. The first and second wet etching processes each may include applying a tetramethylammonium hydroxide (TMAH) solution.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making a semiconductor device, comprising:
    forming a material layer on a substrate;
    forming a sacrificial layer on the material layer;
    forming a patterned photoresist layer on the sacrificial layer;
    applying a first wet etching process to etch the sacrificial layer to form a patterned sacrificial layer using the patterned photoresist layer as a mask;
    applying a second wet etching process to etch the material layer;
    applying a third wet etching process to remove the patterned sacrificial layer; and
    removing the patterned photoresist layer after the applying the first wet etching process and before the applying the third wet etching process.

2. The method of claim 1, removing the patterned photoresist layer after the applying the first wet etching process and before the applying the third wet etching process includes applying a wet chemical to remove the patterned photoresist layer.

3. The method of claim 2, wherein the applying the wet chemical is implemented before the applying the second wet etching process.

4. The method of claim 1, wherein the material layer comprises titanium nitride (TiN).

5. A method for making a semiconductor device, comprising:
    forming a material layer on a substrate;
    forming a sacrificial layer on the material layer;
    forming a patterned photoresist layer on the sacrificial layer;
    applying a first wet etching process to etch the sacrificial layer to form a patterned sacrificial layer using the patterned photoresist layer as a mask;
    applying a second wet etching process to etch the material layer; and
    applying a third wet etching process to remove the patterned sacrificial layer,
    wherein the sacrificial layer comprises lanthanum oxide (LaO).

6. The method of claim 5, wherein the first and third wet etching processes each comprises an etchant having a hydrochloric acid (HCl).

7. The method of claim 5, wherein the first and third wet etching processes each comprises applying carbon oxide (CO2) water.

8. The method of claim 1, wherein the sacrificial layer comprises aluminum oxide (Al2O3).

9. The method of claim 8, wherein the first and third wet etching processes each comprises applying a tetramethylammonium hydroxide (TMAH) solution.

10. The method of claim 1, wherein the first wet etching process comprises applying a weak acid solution selected from the group consisting of CO2 water, acetic acid solution, citric acid, boric acid, and phosphoric acid.

11. The method of claim 1, wherein the second wet etching process comprises applying an ammonia hydroxide-hydrogen peroxide-water mixture (APM).

12. The method of claim 1, further comprising applying hexamethyl disilazane (HMDS) to the sacrificial layer before the forming the patterned photoresist layer.

13. The method of claim 1, further comprising applying a cleaning material to the patterned photoresist layer before the applying the first wet etching process.

14. A method for making a semiconductor device comprising:
   forming a titanium nitride (TiN) layer on a substrate;
   forming a lanthanum oxide ((LaO) layer on the TiN layer;
   forming a patterned photoresist layer on the LaO layer;
   applying a first wet etching process to the substrate to etch the LaO layer to form a patterned LaO layer using the patterned photoresist layer as a mask;
   applying an ammonia hydroxide-hydrogen peroxide-water mixture (APM) to the substrate to etch the TiN layer; and
   applying a second wet etching process to remove the LaO layer.

15. The method of claim 14, further comprising applying a wet chemical to the substrate to remove the patterned photoresist layer after the applying the first wet etching process and before the applying the APM.

16. The method of claim 14, further comprising applying a wet chemical to the substrate to remove the patterned photoresist layer after the applying the APM and before the applying the second wet etching process.

17. The method of claim 15, wherein the wet chemical is selected from the group consisting of N-methyl-2-pyrrolidine (NMP), cyclohexanol, cyclopentanol, dimethy sulfoxide (DMSO), propylene glycol monomethyl ether (PGME) and Propylene glycol monomethyl ether acetate (PGMEA).

18. The method of claim 14, wherein the first and second wet etching processes each comprises an etchant having hydrochloric acid (HCl) and water (H2O).

19. The method of claim 14, wherein first and second wet etching processes each comprises an etchant having a resist developer.

20. The method of claim 14, wherein the first wet etching process comprises applying to the substrate with a weak acid solution selected from the group consisting of carbon oxide (CO2) water, acetic acid solution, citric acid, boric acid and phosphoric acid.

* * * * *